United States Patent
Strauser et al.

(10) Patent No.: US 8,125,341 B2
(45) Date of Patent: Feb. 28, 2012

(54) RESONANT TAG WITH REINFORCED DEACTIVATION DIMPLE

(75) Inventors: Seth Strauser, Sewell, NJ (US); Charles Iacono, Mount Laurel, NJ (US); Gary Mazoki, Sewell, NJ (US); Anthony Piccoli, Thorofare, NJ (US); Hideki Imaichi, Kanagawa (JP)

(73) Assignee: Checkpoint Systems, Inc., Thorofare, NJ (US)

( * ) Notice: Subject to any disclaimer, the term of this patent is extended or adjusted under 35 U.S.C. 154(b) by 607 days.

(21) Appl. No.: 12/329,213

(22) Filed: Dec. 5, 2008

(65) Prior Publication Data
US 2009/0146818 A1 Jun. 11, 2009

Related U.S. Application Data

(60) Provisional application No. 61/012,588, filed on Dec. 10, 2007.

(51) Int. Cl.
G08B 13/14 (2006.01)

(52) U.S. Cl. ................... 340/572.3; 361/750

(58) Field of Classification Search ........... 340/572.3, 340/572.5, 572.7; 361/748, 750
See application file for complete search history.

(56) References Cited

U.S. PATENT DOCUMENTS

| 4,857,381 A * | 8/1989 | Suzuki ............ 428/120 |
| 5,142,270 A | 8/1992 | Appalucci et al. |
| 5,354,599 A * | 10/1994 | McClanahan et al. ........ 361/748 |
| 5,861,809 A | 1/1999 | Eckstein et al. |
| 6,262,663 B1 | 7/2001 | Altwasser et al. |
| 6,613,609 B1 | 9/2003 | Laviron et al. |
| 7,168,623 B1 * | 1/2007 | Royer ............ 235/492 |
| 2003/0107486 A1 | 6/2003 | Okamoto et al. |
| 2006/0022828 A1 * | 2/2006 | Prat et al. ............ 340/572.3 |

FOREIGN PATENT DOCUMENTS

| EP | 0304516 A1 | 3/1989 |
| FR | 2785072 A1 | 4/2000 |
| FR | 2848324 A1 | 6/2004 |

OTHER PUBLICATIONS

International Search Report for PCT/US2008/086092 mailed May 25, 2009.

* cited by examiner

*Primary Examiner* — John A Tweel, Jr.
(74) *Attorney, Agent, or Firm* — Caesar, Rivise, Bernstein, Cohen & Pokotilow, Ltd.

(57) ABSTRACT

A resonant circuit for use with a radio-wave detection system for the prevention of shoplifting or the like, which is formed on a flexible substrate and has a coil and capacitor circuit whereby the capacitor has an indented area in the dielectric of the capacitor to promote disablement of the circuit when exposed to a strong electromagnetic field. Upon exposure to a strong electromagnetic field, an electrical short forms across the dielectric of capacitor in the indented area. Because the short is fragile and can be opened by flexure of the circuit, an island of reinforcing material is formed in the indented area, such that when the substrate is flexed, the indented area remains rigid to protect the short. The indented area can be further stress-relieved by introducing a gap in the conductors forming the capacitor plates.

18 Claims, 7 Drawing Sheets

RESONANT TAG WITH REINFORCED DEACTIVATION DIMPLE

CROSS-REFERENCE TO RELATED APPLICATIONS

This utility application claims the benefit under 35 U.S.C. §119(e) of Provisional Application Ser. No. 61/012,588 filed on Dec. 10, 2007 and entitled Resonant Tag with Reinforced Deactivation Dimple, the entire disclosure of which is incorporated by reference herein.

SPECIFICATION

BACKGROUND OF THE INVENTION

1. Field of the Invention

The present invention relates to a resonant circuit used for the prevention of shoplifting or the like, and more particularly, to a resonant circuit having a capacitor formed on a flexible substrate wherein the capacitor is deactivated at a dimpled area by exposure to a predetermined voltage level.

2. Description of Related Art

In retail shops, libraries or the like, a surveillance system including a resonant tag that resonates with a radio wave, a transmitting antenna and a receiving antenna has been used for the prevention of shoplifting. In an embodiment, the resonant tag is composed of an insulating film, a coil and a plate made of a conductive metal foil formed on one side of the insulating film, and a plate made of a conductive metal foil formed on the other side, which constitute an LC circuit and resonates with a radio wave at a particular frequency.

If an article with the resonant circuit attached passes through a surveillance area without being disabled at checkout, the resonant circuit resonates with the radio wave from the transmitting antenna, and the receiving antenna detects the resonance and generates an alarm. A typically used resonant frequency is 5 to 15 MHz, because frequencies within the range can be easily distinguished from various noise frequencies. In electronic article surveillance (EAS), a frequency of 8.2 MHz is most popularly used, and in radio frequency identification (RFID), a frequency of 13.56 MHz is most popularly used.

Figure 1:
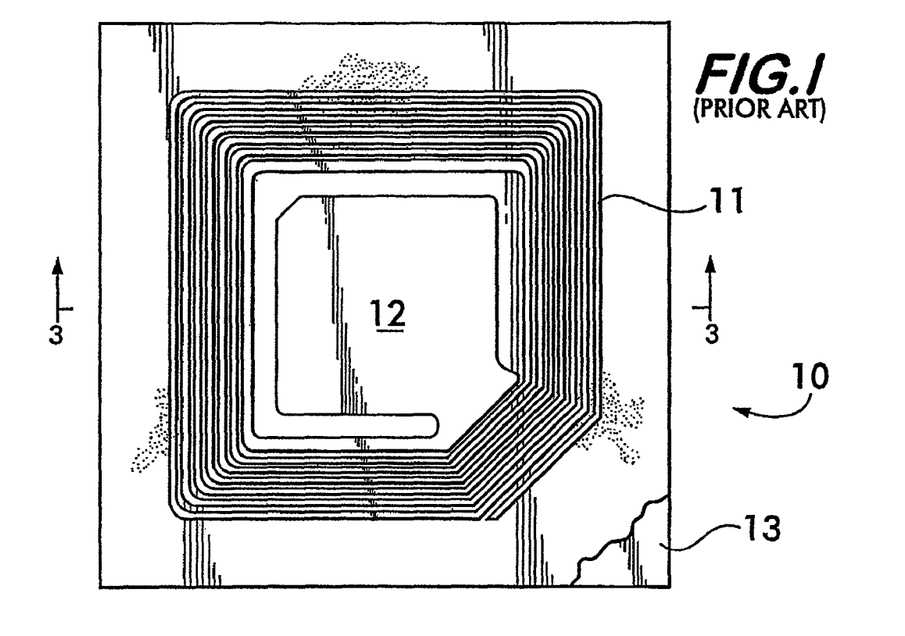
FIG. 1 is an enlarged plan view of one side of a prior art resonant tag.
Figure 2:
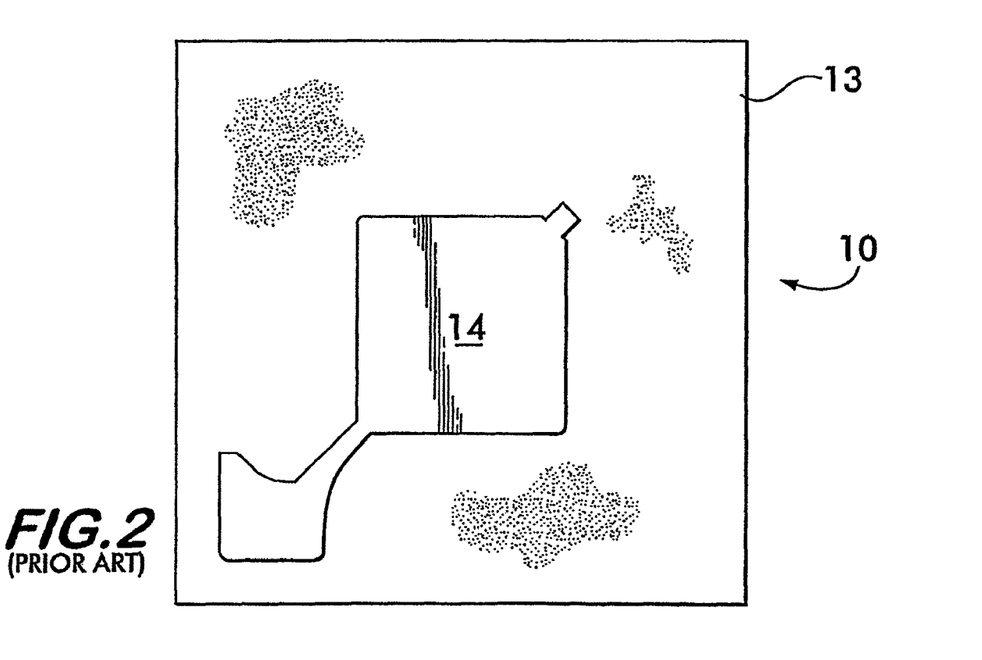
FIG. 2 is an enlarged plan view of the other side of the prior art resonant tag of FIG. 1.
Figure 3:
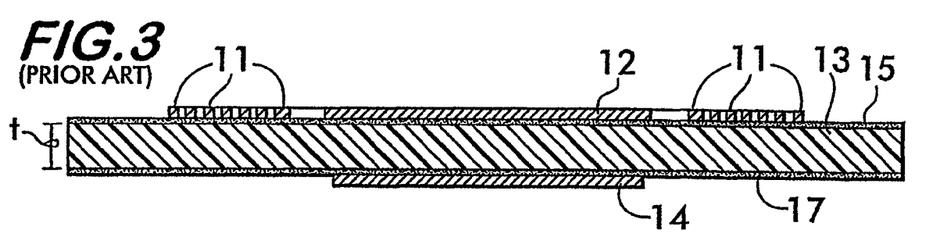
FIG. 3 is a cross-sectional view of the prior art resonant tag taken along line 3-3 of FIG. 1.
Figure 4:
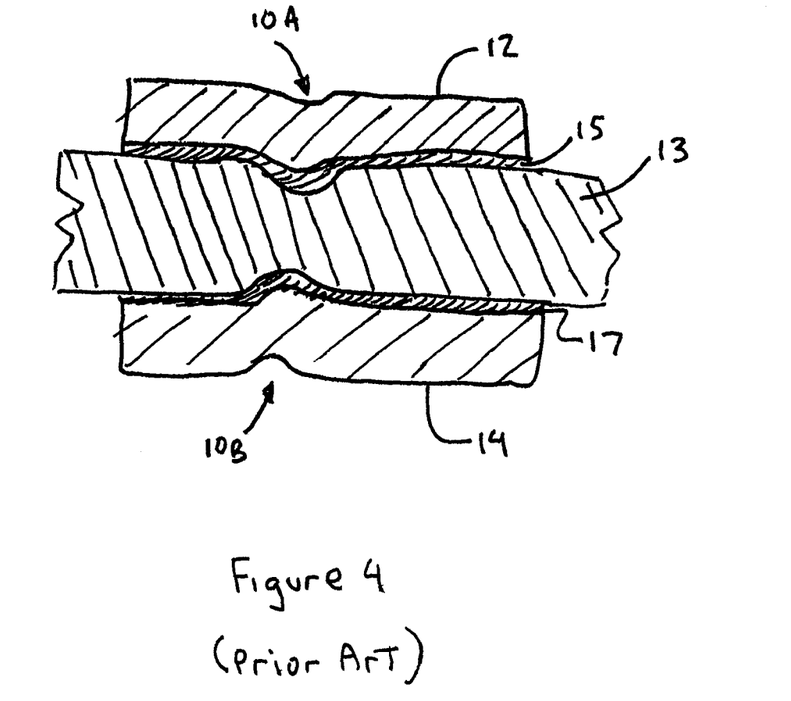
FIG. 4 is a cross-sectional view of a narrowed area in a prior art resonant tag.

By way of example only, FIGS. 1-3 depict a prior art LC resonant circuit in the form of a tag 10 which includes a coil 11 and a first capacitor plate 12 on one side (FIG. 1) of a substrate 13 and a second capacitor plate 14 on the other side of the substrate 13 (FIG. 2). FIG. 3 is a cross-sectional view of this prior art tag showing a typical substrate thickness, t, of approximately 20 microns, which tends to be the thinnest dielectric that can be formed using conventional dielectric forming methods (e.g., extruding polyethylene between the metal layer). Adhesive layers 15 and 17 secure the metal layers to the substrate 13 respectively.

Prior art resonant tags formed as in FIGS. 1-4 are commonly deactivated, once an article with the resonant tag is purchased, by application of a predetermined voltage to the tag. The tag typically has a thinned part of the dielectric (FIG. 4: 10a, 10b) commonly referred to as a dimple. The dimple provides a shorter distance between the tip of the dimple and the opposing plate, than between the remaining surfaces of the two plates. When a high level of electromagnetic energy is applied to the tag, a voltage in excess of the breakdown voltage can be created between the tip of the dimple and the opposing plate. This causes the dielectric material to break down, thereby substantially short circuiting the two plates to each other. When the capacitor shorts out in the weakened area, its capacitance goes substantially to zero and the resonant frequency of the tag is moved out of the range of frequencies being swept by the detection equipment. Such a dimple for deactivating a resonant tag is disclosed in U.S. Pat. No. 5,142,270, entitled "Stabilized Resonant Tag Circuit and Deactivator," issued to Appalucci et al. on Jul. 8, 1992.

One problem with the known methods for deactivating tags is that a tag may spontaneously reactivate at a later time. It is believed that one reason why tags reactivate may be that the short circuit between the plates of the capacitor is formed by fragile dendritic structures created by the breakdown of the dielectric. The structures providing the short circuit between the plates can therefore break at a later time, for example, due to flexing of the tag, and restore the high resistance path between the plates. When this occurs, a security tag that is deactivated after a legitimate purchase can set off an alarm if an innocent bearer of the tag inadvertently brings it into a detection region. This problem commonly occurs when the tag is attached to an article of clothing and not removed by the purchaser before wearing the clothing. Flexure of the tag in normal wear of the clothing and in washing can cause the tag to reactivate due to damage to the dendritic structures.

In resonant tags having polyethylene dielectrics, as many as 50% of the tags become reactivated with wearing or laundering. This unintended reactivation has undesirable consequences for the wearer of the clothing, who will activate security tag detection devices when entering or exiting any store with equipment tuned to the tag's resonant frequency. Not only is the false alarm inconvenient and embarrassing for the person wearing the clothing with the reactivated tag, but frequent false alarms can cause a "boy who cried wolf" effect. Store personnel can become lax about enforcement of tag alarms when many of them are falsely triggered by reactivated tags on legitimately purchased goods. The inconvenience and embarrassment of false alarms may so irritate consumers that sales of clothing brands bearing re-activatable tags are lost.

Thus a need exists for an improved resonant circuit with a capacitor that incorporates a dimple to form a shorted area when the tag is disabled, wherein the shorted area does not later return to its original state, thereby returning the tag to a functioning resonant circuit under physical distortion of the tag or temperature swings.

BRIEF SUMMARY OF THE INVENTION

An object of the present invention is to provide a resonant circuit mainly used in a radio-wave detection system for the prevention of shoplifting or the like that is permanently disabled by application of a predetermined voltage which causes formation of a permanent short in a capacitor located in the circuit.

As a result of earnest study, the inventors have found that the object described above can be attained if a capacitor formed on a flexible substrate and having a dimpled area for disablement of the capacitor when it is exposed to a predetermined voltage has a reinforcing material applied in a region near the dimpled area and where the plates of the capacitor have a geometry that provides a stress relief at the boundary between the reinforced area and the rest of the capacitor.

Briefly, the present invention is as follows. A resonant tag resonates with a radio wave at a predetermined frequency and comprises: an inductor, which can be a coil formed in essentially two dimensions and made of a metal foil or printed with a conductive material, and a capacitor formed of two plates of metal foil on a dielectric and having a predetermined breakdown voltage, such that once that voltage is exceeded the capacitor is shorted. The capacitor contains a dimpled area where the thickness of the dielectric is more narrow than in the remaining area of the capacitor, this thinned area promotes shorting the capacitor at a lower voltage than where there is no thinned area. The thinned area is reinforced such that when the tag is flexed, the reinforced thinned area does not flex, rather the rest of the tag flexes around the reinforced area so that the short is not disturbed, thus preventing the capacitor from becoming un-shorted and the tag from becoming reactivated.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 5:
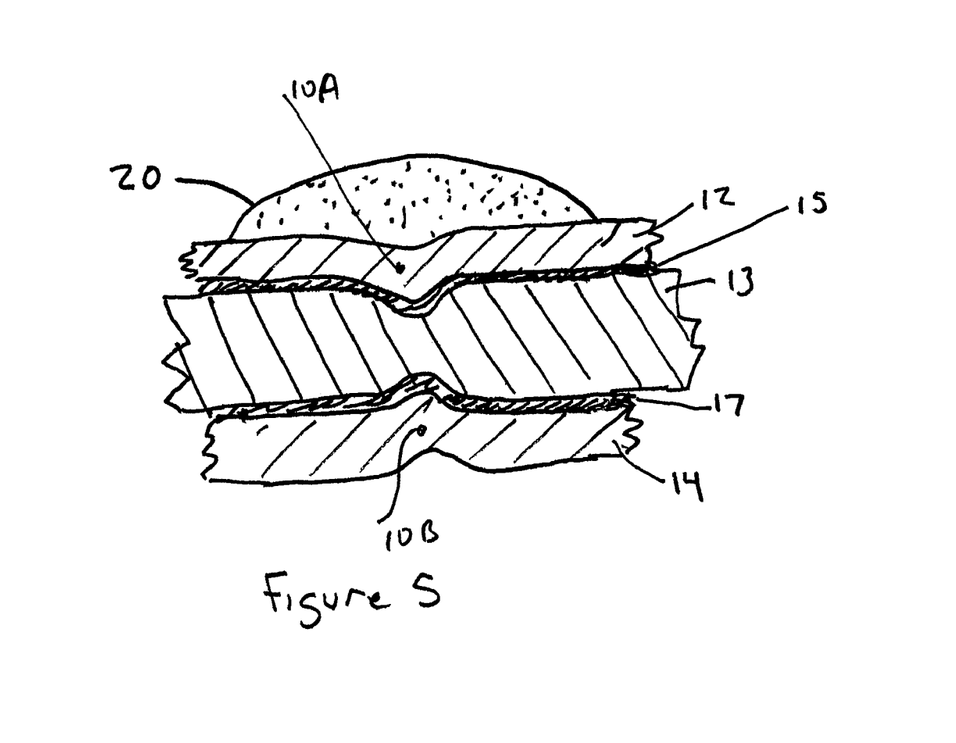
FIG. 5 is a cross-sectional view of an embodiment of a reinforced narrowed area.

FIG. 5 is a cross-sectional view of the dimpled area described above for the prior art tag shown in FIG. 4. FIG. 5 shows a dielectric substrate 13 to which is attached metal foil layers 12 and 14. The metal foil is attached to the substrate 13 with adhesive layers 15, 17. Together, the metal foil 12, 14 and the dielectric 13 form a capacitor component of an exemplary resonant tag as shown in FIGS. 1 and 2. An indentation 10A, 10B is made in on the top and bottom of the capacitor, thinning the dielectric 13 in this area and bringing the metal foil layers 12, 14 closer together. This point is where a short will form when the resonant tag is exposed to a strong electromagnetic field at the resonant frequency of the tag. In an embodiment of the invention, a reinforcing material 20 is attached to the top of the indented area 10A. In an exemplary embodiment, the reinforcing material 20 is an epoxy. The epoxy can be applied as a liquid and cured to form a rigid material affixed to and covering the capacitor in the area of the indentation. The epoxy can be cured by known methods such as ambient air drying, exposure to heat or exposure to ultraviolet light. Other reinforcing materials include acrylics, acrylates, cyanoacrylates, urethane-acrylates, polyesters, phenolics, melamines, vinyls, and rubbers.

Because the tag is reinforced in the area of the indentation with the rigid material 20, when the tag is flexed, for example when embedded in clothing being worn, the tag will flex around the rigid area, but the rigid area itself will not flex. This protects the delicate indented area that contains the short and keeps the short from opening and reactivating the tag.

Figure 6:
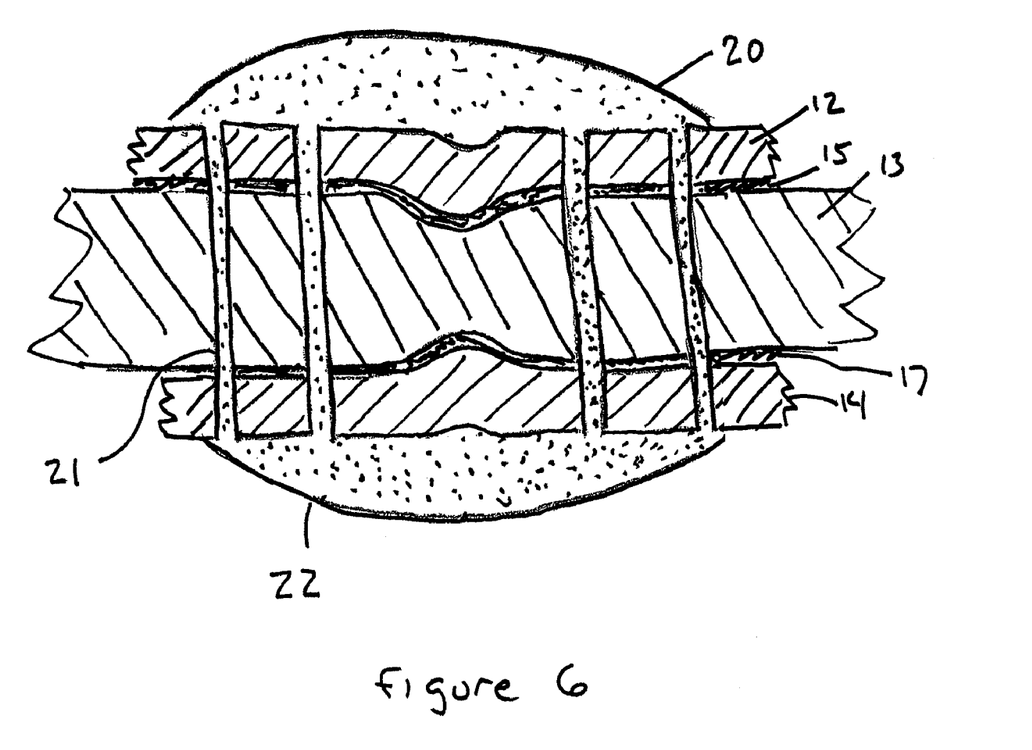
FIG. 6 is a cross-sectional view of an embodiment of a reinforced narrowed area with vias through the substrate and reinforcement filling the vias.

FIG. 6 is a cross-sectional view of a further embodiment of reinforcing the indented area. In this embodiment, vias 21 are created through the metal foil and dielectric in the area of the indentation flowable material such as epoxy is applied to the top and bottom of the indented area so that it also fills the vias. A via is typically a circular hole such as one made with a drill, although channels of any shape that provide a physical path from the top to the bottom surface of the tag can be used. Once the flowable material hardens, it creates a three-dimensional rigid structure that has the effect of clamping the top and bottom layers 12, 14 of the capacitor together and forms a strong reinforcement around the indented area 10A, 10B. The two-sided reinforcement with filled vias, shown in FIG. 6 has the additional advantage that the reinforcing caps 20, 22 are held firmly to the substrate not only by adhesion to the foil layers 12, 14 but also by the filled vias 22. This prevents the reinforcing cap 20 from peeling away from the dielectric substrate with the foil layer 12.

Figure 7:
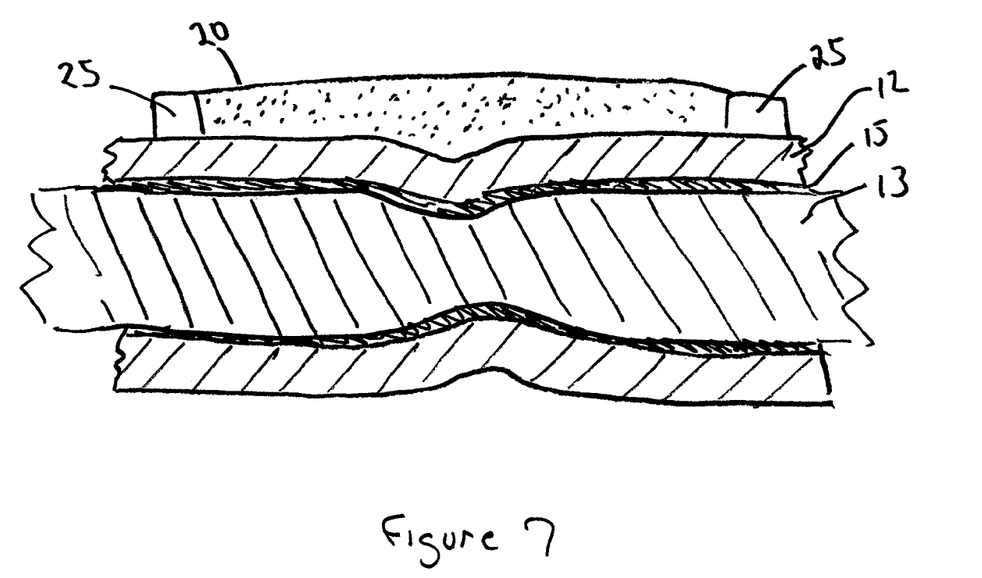
FIG. 7 is a cross-sectional view of an embodiment of a reinforced narrowed area with a potting dam to contain the reinforcement material.
Figure 8:
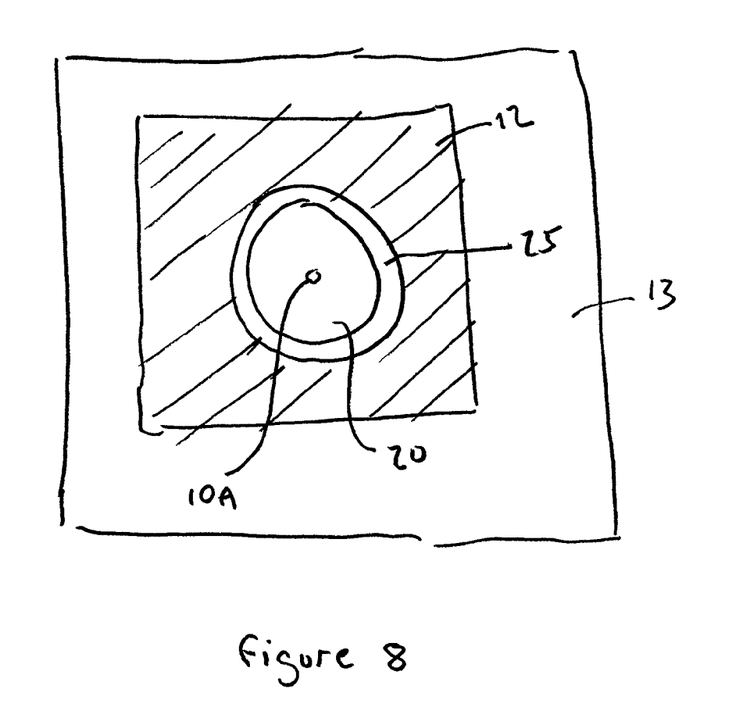
FIG. 8 is a plan view of an embodiment of a reinforced narrowed area with a potting dam to contain the reinforcement material.

In another embodiment, shown in FIGS. 7 and 8, the reinforcing cap 20 is formed by applying a barrier 25 to the foil layer and then filling the crater created by the barrier 25 with a flowable material such as an epoxy. A typical thickness for the barrier and the epoxy is 0.040 inches. A typical diameter for the epoxy cap is between 2.5 and 10 mm.

Figure 9:
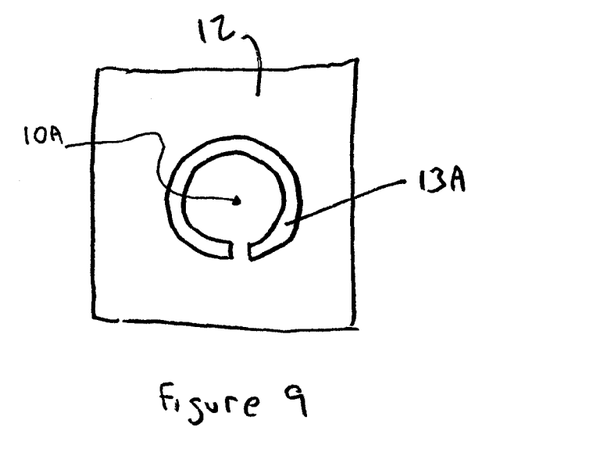
FIG. 9 is a plan view of an embodiment of a capacitor having a stress relieved area.
Figure 10:
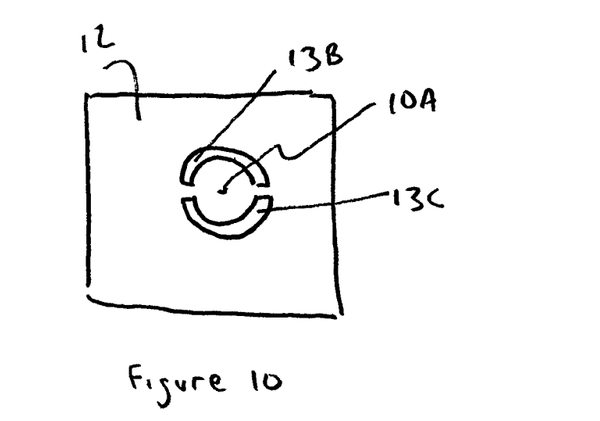
FIG. 10 is plan view of a further embodiment of a capacitor having a stress relieved area.
Figure 11:
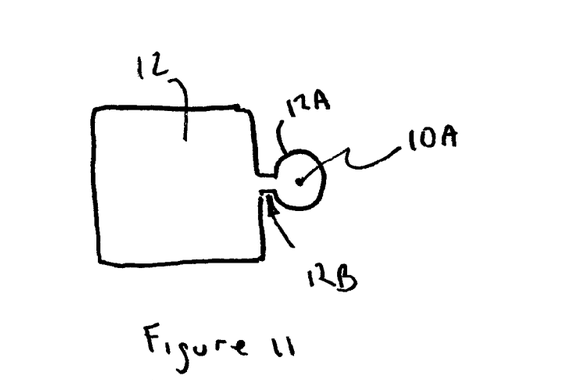
FIG. 11 is plan view of a further embodiment of a capacitor having a stress relieved area.

FIGS. 9 through 11 show embodiments of means for stress relieving the indented area 10A. In FIGS. 9 and 10, the foil pattern 12 of the capacitor plate is broken up by an area 13A-C which has no foil and is only dielectric material. With the central area inside the openings 13A-C covered with a cap as detailed above, the tag, when flexed, will bend first in the relieved areas 13A-C because they are less thick by not being covered with foil. While FIGS. 9 and 10 show a typical pattern for the top side of a tag, the same stress relief pattern can be used on the bottom foil layer as well, creating so that the only material in the relieved areas 13A-C is the dielectric layer 13. With reference to FIG. 5, exemplary thicknesses are 8-20 um dielectric 13, 30-120 um top foil layer and 4 um-20 um bottom foil layer Thus, it can be seen that the stress relief areas 13A-C are significantly thinner and less stiff than the foil-covered areas. This promotes flexing of the tag at the relief areas 13A-C and removes much of any stress due to flexing from the reinforced indented area 10A.

FIG. 11 shows another embodiment of means for stress relieving the reinforced indented area 10A. In the embodiment shown, the foil pattern of the capacitor plate 12 includes a peninsula of material 12A that is separated from the majority of the foil by a narrow band 12B. The indented area 10A is included in this peninsula area and that area is reinforced with a suitable material as described above. Flexing a tag having a foil pattern as shown in FIG. 11 will result in the flex to occur at the most narrow part of the foil, 12B, which will protect the reinforced area 12A from stress that might otherwise damage the reinforcing material.

The stress relief patterns shown in FIGS. 9-11 are examples only and it is intended that the invention encompass all means of foil patterning that reduce bending stress on the reinforced area containing the indentation.

Reinforcing an indented area in a capacitor made on film dielectric can also be used in embodiments where the capacitor is a separate component of a security tag. Capacitors formed as straps to be applied to a tag are described in U.S. patent application Ser. No. 11/539,995, which is assigned to Checkpoint Systems. All references cited herein are incorporated by reference.

Figure 12:
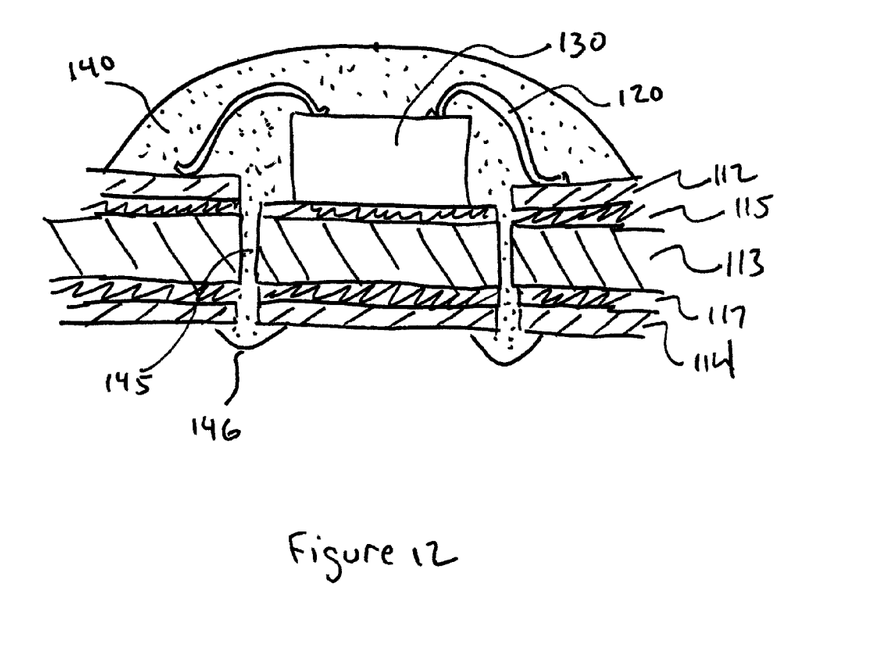
FIG. 12 is a cross-sectional view of a wire-bonded circuit component reinforced in accordance with an embodiment of the invention.
Figure 13:
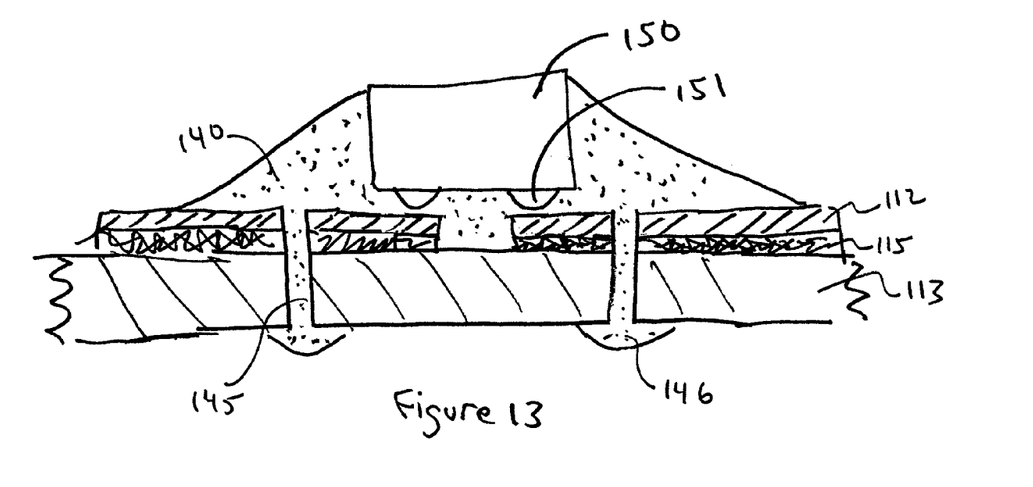
FIG. 13 is a cross-sectional view of a flip chip circuit component reinforced in accordance with an embodiment of the invention.

The reinforcement means described herein are not limited to reinforcing a foil indentation in a capacitor formed on a flexible substrate. FIGS. 12 and 13 show the reinforcement of circuit components wire-bonded and soldered to conductive foil respectively. FIG. 12 shows a component 130 on a tag comprising a flexible substrate 113, electrically conductive foil 112, 114 attached to the substrate 113 with adhesive 115, 117. Vias 145 are made through the substrate and foil material and a flowable material is provided to form a reinforcing cap 140 over the component 130. The flowable material fills the vias 145 and forms small domes 146 under the vias. Once hardened, these domes and the vias, tied to the main reinforcing dome 140 form a protective cap over the component 130 and the wire bonds 120, whereby the cap is also anchored to the underside of the structure by the vias and the small underside domes. This arrangement reinforces the flexible circuit in the area of the component 130 and the top dome 140 and the component 130 are prevented from pulling away from the substrate 113 by the anchoring effect of the vias 145 and the underside domes 146. The circuit component can be a simple passive component, such as a chip capacitor, resistor or inductor, or a semiconductor, such as a diode or a transistor or an integrated circuit.

In a similar fashion a flip chip device 150 that is connected to circuitry through solder bumps 151 can also be reinforced in the manner described for the wire-bonded device on a circuit having a flexible substrate 113 as shown in FIG. 13. The circuits shown in FIGS. 12 and 13 can be resonant tags, RFID tags, component-carrying straps for application to resonant tags or other flexible circuits for use in other applications.

While the invention has been described in detail and with reference to specific examples thereof, it will be apparent to one skilled in the art that various changes and modifications can be made therein without departing from the spirit and scope thereof.

What is claimed is:

1. A resonant tag resonating with a radio wave at a predetermined frequency, comprising:
    a dielectric film;
    a first circuit comprising a first metal foil including a coil portion and a plate portion, which comprises a first plate of a capacitor, formed on one side of said dielectric film;
    a second circuit made of a second metal foil including a plate section which comprises a second plate of said capacitor, formed on the other side of said dielectric film;
    wherein said both circuits comprise an LC circuit by being electrically connected; and
    wherein a portion of at least one of said capacitor plates is indented into said dielectric film such that said capacitor plates are closer together at said indentation than at the remaining portions of said capacitor plates, said indentation creating means for deactivating said resonant tag circuit in response to an electromagnetic field of sufficient energy to destroy the resonant properties of said circuit; and
    wherein said indentation is physically reinforced by a reinforcement material in the area of said indentation, said reinforcement material having a perimeter and wherein said reinforcement material is stress relieved by a gap in at least one of said metal foils along a portion of said perimeter.

2. The resonant tag of claim 1, wherein said reinforcement material is an epoxy.

3. The resonant tag of claim 1, wherein said reinforcement material is applied to both of said capacitor plates.

4. The resonant tag of claim 3, wherein said resonant tag comprises vias through said capacitor plates and dielectric film within said perimeter and said reinforcement material fills said vias.

5. The resonant tag of claim 1, wherein said reinforcement material is substantially circular with a diameter of between 2-10 mm.

6. The resonant tag of claim 1, wherein said capacitor plates are formed close to an edge of said resonant tag.

7. A capacitor formed as a strap for use in a resonant circuit, which resonates with a radio wave within a predetermined frequency range, comprising:
    a first electrically conductive planar element,
    a second electrically conductive planar element and
    a dielectric disposed between at least portions of said first and second electrically conductive planar elements wherein
    at least one of said electrically conductive planar elements is indented into said dielectric such that said electrically conductive planar elements are closer together at said indentation than at the remaining portions of said electrically conductive planar elements, said indentation creating means for altering the capacitance of the capacitor in response to application of a voltage exceeding a predetermined threshold to the capacitor; and wherein
    said indentation is physically reinforced by a reinforcement material in the area of said indentation, said reinforcing material having a perimeter and wherein said reinforcement material is stress relieved by a gap in at least one of said metal foils along a portion of said perimeter.

8. The capacitor of claim 7, wherein said material is selected form the group consisting of an epoxy acrylics, acrylates, cyanoacrylates, and urethane-acryalates, acrylates, cyanoacrylates, urethane-acrylates, and polyesters; less common but worthy of inclusion are phenolics, melamines, vinyls, rubbers, and polyesters.

9. The capacitor of claim 7, wherein said reinforcement material is applied to both of said electrically conductive planar elements.

10. The capacitor of claim 7 wherein said capacitor comprises vias through said electrically conductive planar elements and said dielectric within said perimeter and said reinforcement material substantially fills said vias.

11. The resonant tag of claim 10, wherein said material is substantially circular with a diameter of between 2-10 mm.

12. A method for reinforcing a circuit element on a flexible substrate having a top and bottom surface comprising:
    creating openings in the substrate between the top and bottom surfaces in the area of the circuit element;
    applying a flowable reinforcing material in the area of said circuit element on both sides of the substrate such that said flowable material fills said openings and covers a portion of the top and bottom surface wherein said circuit element is a capacitor formed of electrically conducting plates on the top and bottom sides of the substrate and the substrate is a dielectric material, said capacitor having a portion of at least one of said electrically conductive plates indented in said dielectric such that said electrically conductive plates are closer together at said indentation than at the remaining portions of said electrically conductive plates, said indentation creating means for altering the capacitance of the capacitor in response to application of a voltage exceeding a predetermined threshold to the capacitor; and wherein said flowable reinforcing material surrounds said indented portion and forms a perimeter and wherein said flowable reinforcing material is stress relieved by a gap in at least one of said plates along a portion of said perimeter.

13. The method of claim 12, wherein said flowable material is an epoxy that becomes rigid when cured.

14. The method of claim 12, further comprising applying a potting dam to surround said area of said circuit element, said potting dam creating a barrier to contain said flowable material to said area of said circuit element.

15. The method of claim 12, wherein said flowable material is applied with an ink jet process.

16. The method of claim 12 wherein said circuit element is affixed to the top surface of the substrate and is electrically connected to conductors on the top surface with wire bonds and wherein said flowable reinforcing material encapsulates the circuit element and said wire bonds.

17. The method of claim 12 wherein said circuit element is a flip chip device and is affixed to the top surface of the substrate and is electrically connected to conductors on the top surface with solder pads on the underside of the circuit element and wherein said flowable reinforcing material encapsulates the circuit element.

18. The method of claim 12, wherein said flowable material is applied with a syringe.

* * * * *

UNITED STATES PATENT AND TRADEMARK OFFICE
CERTIFICATE OF CORRECTION

PATENT NO. : 8,125,341 B2  
APPLICATION NO. : 12/329213  
DATED : February 28, 2012  
INVENTOR(S) : Strauser et al.

Page 1 of 1

It is certified that error appears in the above-identified patent and that said Letters Patent is hereby corrected as shown below:

Title Page, Item (75) "Inventors", the inventor's name reading (Hideki Imaichi) should read --Hideaki Imaichi--.

Signed and Sealed this  
Nineteenth Day of March, 2013

Teresa Stanek Rea  
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,125,341 B2 | |
| APPLICATION NO. | : 12/329213 | |
| DATED | : February 28, 2012 | |
| INVENTOR(S) | : Strauser et al. | |

It is certified that error appears in the above-identified patent and that said Letters Patent is hereby corrected as shown below:

In the Specification

Col. 2, line 6, the date "Jul. 8, 1992" should be "Aug. 25, 1992."

In the Claims

Claim 8, col. 2., lines 45-50, should read as: "The capacitor of claim 7, wherein said material is selected from the group consisting of an epoxy acrylics, acrylates, cyanoacrylates, urethane-acrylates, and polyesters; less common but worthy of inclusion are phenolics, melamines, vinyls, rubbers, and polyesters."

Signed and Sealed this
Eighth Day of October, 2013

Teresa Stanek Rea
*Deputy Director of the United States Patent and Trademark Office*